(12) United States Patent
Derluyn et al.

(10) Patent No.: US 9,847,412 B2
(45) Date of Patent: Dec. 19, 2017

(54) DEVICE COMPRISING A III-N LAYER STACK WITH IMPROVED PASSIVATION LAYER AND ASSOCIATED MANUFACTURING METHOD

(71) Applicant: EPIGAN NV, Hasselt (BE)

(72) Inventors: Joff Derluyn, Sint-Joris-Weert (BE); Stefan Degroote, Scherpenheuvel-Zichem (BE); Marianne Germain, Liege (BE)

(73) Assignee: EpiGaN nv, Hasselt (BE)

( * ) Notice: Subject to any disclaimer, the term of this patent is extended or adjusted under 35 U.S.C. 154(b) by 0 days.

(21) Appl. No.: 14/379,485

(22) PCT Filed: Oct. 12, 2012

(86) PCT No.: PCT/EP2012/070326
§ 371 (c)(1),
(2) Date: Aug. 18, 2014

(87) PCT Pub. No.: WO2013/124010
PCT Pub. Date: Aug. 29, 2013

(65) Prior Publication Data
US 2015/0008444 A1    Jan. 8, 2015

(30) Foreign Application Priority Data
Feb. 23, 2012 (GB) .................................. 1203161.3

(51) Int. Cl.
*H01L 29/15* (2006.01)
*H01L 31/0256* (2006.01)
(Continued)

(52) U.S. Cl.
CPC ...... *H01L 29/7787* (2013.01); *H01L 21/0217* (2013.01); *H01L 21/283* (2013.01);
(Continued)

(58) Field of Classification Search
CPC .................................................... H01L 29/2003
(Continued)

(56) References Cited

U.S. PATENT DOCUMENTS

| 8,791,034 B2 | 7/2014 | Shealy |
| 2006/0019435 A1 | 1/2006 | Sheppard et al. |

(Continued)

FOREIGN PATENT DOCUMENTS

| JP | 2006279032 A | * 10/2006 |
| JP | 2007-317805 | 12/2007 |

(Continued)

OTHER PUBLICATIONS

Machine translation of Yanagihara et al., JP 2006279032, Oct. 12, 2006.*

(Continued)

*Primary Examiner* — Hsin-Yi Hsieh
(74) *Attorney, Agent, or Firm* — McDonnell Boehnen Hulbert & Berghoff LLP

(57) ABSTRACT

A device comprising a III-N layer stack featuring a two-dimensional electron gas is disclosed, comprising: —a III-N layer; —a Al-III-N layer on top of the III-N layer; —a passivation layer on top of said Al-III-N layer, the passivation layer comprising Silicon Nitride (SiN); wherein said passivation layer comprises a fully crystalline sub layer at the Al-III-N interface and at least part of the fully crystalline sub layer comprises Al and/or B; and associated methods for manufacturing the device.

27 Claims, 7 Drawing Sheets

(51) Int. Cl.

| | |
|---|---|
| *H01L 29/778* | (2006.01) |
| *H01L 29/20* | (2006.01) |
| *H01L 29/66* | (2006.01) |
| *H01L 21/02* | (2006.01) |
| *H01L 21/283* | (2006.01) |
| *H01L 21/3213* | (2006.01) |
| *H01L 29/201* | (2006.01) |
| *H01L 29/205* | (2006.01) |
| *H01L 29/51* | (2006.01) |

(52) U.S. Cl.
CPC ...... *H01L 21/32133* (2013.01); *H01L 29/201* (2013.01); *H01L 29/2003* (2013.01); *H01L 29/205* (2013.01); *H01L 29/517* (2013.01); *H01L 29/66462* (2013.01)

(58) Field of Classification Search
USPC .......................................................... 257/76
See application file for complete search history.

(56) References Cited

U.S. PATENT DOCUMENTS

| | | |
|---|---|---|
| 2006/0197175 A1 | 9/2006 | Yanagihara et al. |
| 2008/0121896 A1 | 5/2008 | Takizawa et al. |
| 2011/0057232 A1 | 3/2011 | Sheppard et al. |
| 2011/0073910 A1 | 3/2011 | Takizawa et al. |

FOREIGN PATENT DOCUMENTS

| | | |
|---|---|---|
| JP | 2009-283915 | 12/2009 |
| WO | 2010/151855 A2 | 12/2010 |
| WO | WO 2010/151855 A2 | 12/2010 |
| WO | WO 2011/143002 A1 | 11/2011 |

OTHER PUBLICATIONS

PCT International Search Report and Written Opinion, PCT International Application No. PCT/EP2012/070326, dated Jan. 11, 2013.
Tadjer, Marko J. et al., "Electrical and Optical Characterization of AlGaN/GaN HEMTs With In Situ and Ex Situ Deposited SiNx Layers", Journal of Electronic Materials, vol. 39, No. 11, Sep. 10, 2010, pp. 2452-2458.
Takizawa, Toshiyuki et al., "Crystalline SiNx Ultrathin Films Grown on AlGaN/GaN Using In Situ Metalorganic Chemical Vapor Deposition", Journal of Electronic Materials, vol. 37, No. 5, Feb. 6, 2008, pp. 628-634.
Fehlberg, Tamara B. et al., "Transport Studies of AlGaN/GaN Heterostrutures of Different Al Mole Fractions With Variable SiNx Passivation Stress", IEEE Transaction on Electron Devices, No. 58, No. 8, Aug. 1, 2011, pp. 2589-2596.
Yeluri, Ramya et al., "Interface States at the SiN/AlGaN Interface on GaN Heterojunctions for Ga and N-Polar Material", Journal of Applied Physics, vol. 111, No. 4, Feb. 15, 2012, pp. 43718-1-43718-5.
Brown, Richard J. et al., "AlxSiyNz Passivated AlGaN/GaN High Electron Mobility Transistors", Device Research Conference, Jun. 22, 2009, pp. 153-154.
PCT International Preliminary Examination Report, PCT International Application No. PCT/EP2012/070326, dated Jun. 4, 2014.

* cited by examiner

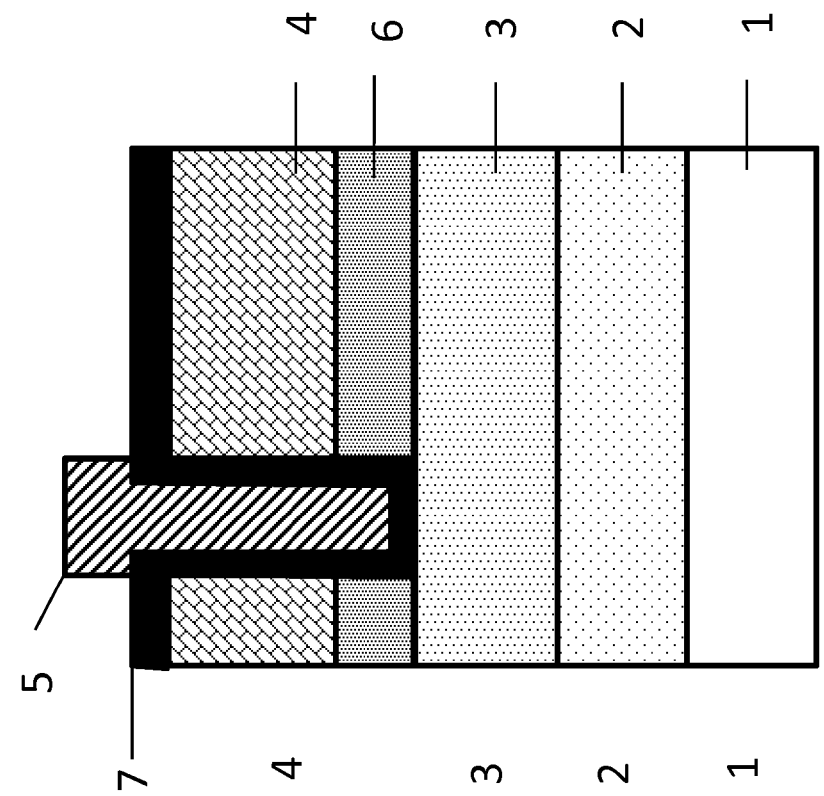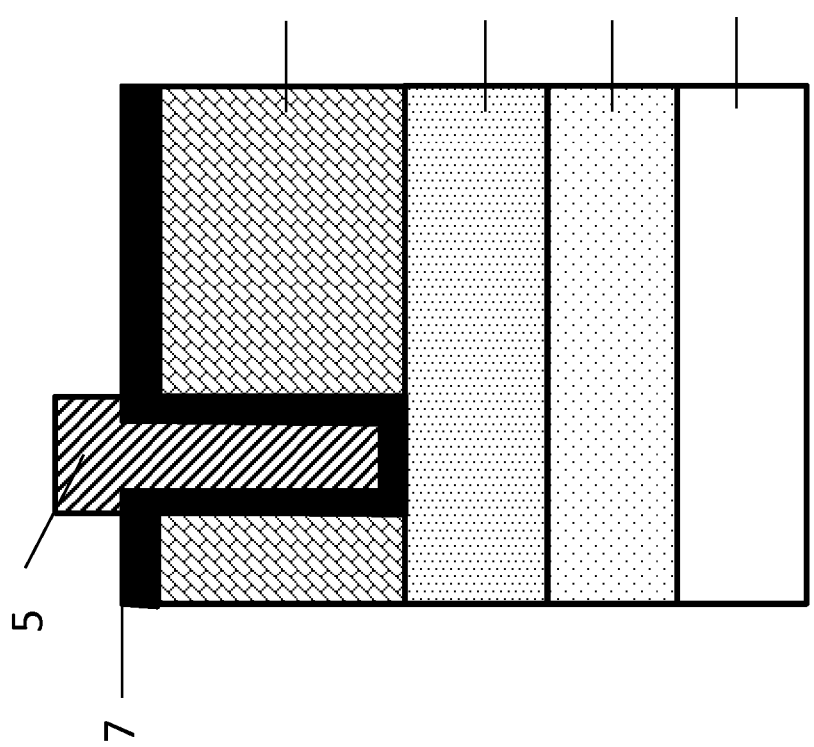

DEVICE COMPRISING A III-N LAYER STACK WITH IMPROVED PASSIVATION LAYER AND ASSOCIATED MANUFACTURING METHOD

This application is a U.S. national phase application of International Patent Application No. PCT/EP2012/070326 filed on Oct. 12, 2012, which claims the benefit of Great Britain patent application 1203161.3, filed Feb. 23, 2012.

TECHNICAL FIELD OF THE INVENTION

The present invention relates to the field of semiconductor processing, more particularly, to devices comprising a III-N layer stack and methods for manufacturing such devices.

BACKGROUND OF THE INVENTION

The use of Silicon Nitride (SiN) as passivation layer for III-N HEMT devices is known. Passivation is important because of dispersion effects and possible changes in the dynamic behaviour of devices. It has been shown that the passivation layer should be sufficiently thick (for instance having a thickness larger than 200 nm). This is illustrated in FIG. 2. SiN can be deposited in-situ.

A SiN layer can also be used as a gate dielectric if it remains between a barrier and a gate of a transistor type device, as depicted in FIG. 1. Such gate dielectric typically reduces the leakage current of the gate and attributes to an improved reliability of the device.

However, when used as a gate dielectric, the SiN layer should not be too thick: separating the actual gate from the two Dimensional Electron Gas (2 DEG) reduces the capacitive coupling between the two which results in a lower transconductance (gm) of the device and a threshold voltage (Vth) which is negative and too high for practical applications. Ideally a SiN gate dielectric layer is between 3 nm and 10 nm thick.

SUMMARY OF THE INVENTION

It is an object of the present invention to provide a device comprising a III-N layer stack featuring a two-dimensional electron gas with improved passivation layer.

This object is met with the methods and means according to the independent claims of the present invention. The dependent claims relate to preferred embodiments.

The improved passivation properties of in-situ SiN are attributed to both a higher density of the SiN and an improved interface to (In)AlGaN:
  ERDA has revealed that in-situ SiN has a high density because of a low hydrogen content. It is known from memory technology, that SiN is very efficient in trapping charges and that hydrogen plays a role in this.
  TEM has revealed the first few monolayers of SiN grow epitaxially onto the (In)AlGaN barrier layer. However, the subsequently grown SiN soon reverts into an amorphous layer. By terminating the surface of the (In) AlGaN barrier with an epitaxially matched layer, there are fewer dangling or ill-terminated bonds. These dangling bonds create trap states in the energy bands so that the elimination of such dangling bonds yields better passivation properties. Moreover, a crystalline SiN has also less dangling bonds in the bulk compared to amorphous SiN—be it terminated by atomic hydrogen or not. Both the unterminated dangling bonds and such dangling bonds terminated by hydrogen create trapping states in the energy bands.

Therefore, the presence of a fully epitaxially grown SiN layer, i.e. a SiN layer that is fully crystalline, is believed to be beneficial for device performance, both when used as passivation layer or gate dielectric.

The passivation properties of a gate dielectric on top of an (In)AlGaN barrier are also very important for device performance. The density of interface states at the interface between the gate dielectric and barrier has a direct impact on electrical device parameters such as high frequency transconductance or sub threshold slope. Because the thickness of the gate dielectric is defined by the epitaxial growth process and not by the uniformity of a processing step such as an etching process, it is very well controlled and the resulting devices have important parameters with very low spread, such as Vth and gate leakage current.

According to a first aspect of the present invention, a device is provided comprising a III-N layer stack featuring a two-dimensional electron gas comprising:
  a III-N layer;
  a Al-III-N layer on top of the III-N layer;
  a passivation layer on top of the Al-III-N layer, the passivation layer comprising Silicon Nitride (SiN);
  wherein the passivation layer comprises a fully crystalline sub layer at the Al-III-N interface and at least part of the fully crystalline sub layer comprises Al or B.

A two-dimensional electron gas (2 DEG) is a gas of electrons free to move in two dimensions, but tightly confined in the third. This tight confinement leads to quantized quantized energy levels for motion in that direction. The electrons appear to be a 2D sheet embedded in a 3D world.

The III-N layer stack can consist of the III-N layer (e.g. GaN layer) and the Al-III-N (e.g. AlGaN, InAlGaN) layer on top of the III-N layer. The 2 DEG can typically be present or generated at the interface between those two layers.

Preferably, the SiN is in-situ grown SiN. It is an advantage that the crystallinity of in-situ grown SiN is maintained by doping it with or adding a species such as Al or B. Takizawa (Journal of Electronic Materials vol 37 issue 5, 2008, page 628, 2008) shows that in-situ SiN has a crystal structure resembling beta-phase SiN. The theoretical in-plane lattice constant of beta-phase SiN is 19% larger than that of GaN, and in-situ SiN therefore deforms into a so-called defect-wurtzite structure when grown on top of GaN to accommodate this strain. It is well-known that large lattice mismatch is a trigger to revert the epitaxial growth mode from a two-dimensional layer-by-layer growth mode into a three-dimensional Volker-Weber growth mode, which is then in turn more prone to turn into an amorphous growth mode. According to aspects of the present invention, a smaller atom than Si is thus incorporated, such as Al or B, to shrink the lattice constant of the beta-phase SiN and match it better to the GaN lattice constant. Moreover, B and Al have very high bond strengths.

The concentration of Al or B in the fully crystalline sub layer can be for instance within the range going from impurity doping levels of about $1e15/cm^3$ up to real alloy concentrations of 10 to 20% (about $1e23/cm^3$). The concentration can be for instance be in the range from $1e15/cm^3$ up to $1e20/cm^3$, or up to $1e19/cm^3$, or up to $1e18/cm^3$, or up to $1e17/cm^3$, or up to $1e16/cm^3$. The concentration can be for instance be in the range from $1e21/cm^3$ to $1e23/cm^3$ or in the range from $1e22/cm^3$ to $1e23/cm^3$.

An additional advantage of the inclusion of Al in the SiN lattice is an improved resistance to dry etching in fluorine-based plasmas, because of the interaction between Al and F which yields highly involatile AlF. This resistance is dependent on the Al content, i.e. it is higher for higher concentrations and lower for lower concentrations. Preferably AlGaN alloys are used as etch stop (Al concentration in the order of 1e23/cm3), as such alloys act as a perfect etch stop (no etching occurs, except for removal by kinetic particles). Lower concentrations will still slow down the etching, and may be still advantageous.

In a preferred approach, the Al-free or less Al-doped SiN would be removed prior to a gate deposition of a transistor device, with the selective etch so that the gate is in direct contact with the Al-doped SiN but it remains in the areas between gate on the one hand and source or drain of the transistor device on the other hand to maintain good passivation properties. It is believed that also B-doped or B-comprising SiN is a good candidate as a layer with high resistance to dry etching in fluorine-based plasmas. The band gaps of Al-doped or Al comprising SiN, and of B-doped or B comprising SiN are much higher than that of SiN, further making these materials a better choice than SiN as a gate dielectric.

According to preferred embodiments, the fully crystalline sub layer comprises at least a few crystalline monolayers.

According to preferred embodiments, the fully crystalline sub layer has a thickness between 0.1 nm and 20 nm, preferably between 3 nm and 10 nm.

According to preferred embodiments, the fully crystalline sub layer comprises Al and/or B throughout the complete layer. The Al or B can for instance be distributed throughout the layer in a homogeneous way. In other words the density of Al or B throughout the layer can be substantially constant.

According to preferred embodiments, at least part of the fully crystalline sub layer or all of the crystalline sub layer is Al and/or B doped.

According to preferred embodiments, the passivation layer further comprises a second SiN sub layer on top of the fully crystalline sub layer.

According to preferred embodiments, the second SiN sub layer does not comprise Al-, does not comprise B-, or does not comprise any of Al and B.

According to preferred embodiments, the fully crystalline sub layer comprises Al and the second SiN sub layer comprises less Al than the fully crystalline sub layer. For instance, the fully crystalline sub layer can be Al doped and the second SiN sub layer can be less Al-doped than the fully crystalline sub layer.

According to preferred embodiments, the fully crystalline sub layer comprises B and the second SiN sub layer comprises less B than the fully crystalline sub layer. For instance the fully crystalline sub layer can be B doped and the second SiN sub layer can be less B-doped than the fully crystalline sub layer.

Note that the fully crystalline sub layer can comprise Al, while the second SiN sub layer can comprise B, or vice versa.

According to preferred embodiments, the device further comprises an AlN or BN layer (intermediate layer) in between the fully crystalline, sub layer and the second SiN sub layer. This can be advantageous as it can improve the selectivity of the contact etch. Preferably, the AlN or BN intermediate layer has a thickness in between 50 nm and 500 nm. It can for instance be about 200 nm thick.

Note that any of the AlN or BN intermediate layer can be combined with the Al- and/or B-comprising fully crystalline sub layer.

According to aspects of the present invention, a dual function passivation stack can thus be provided, for instance comprising Al-doped or B-doped SiN, and on top an Al- or B-free or less Al-doped or less B-doped SiN, where the thickness of the Al-doped SiN or B-doped SiN is suitable for use as a gate dielectric and the total thickness of the passivation layer is large enough to act as a good passivation. At least part of the Al-free and/or B-free SiN may be deposited ex-situ, preferably by LPCVD, but also by PECVD.

According to embodiments of the present invention, the III-N layer stack is grown epitaxially on a substrate. According to preferred embodiments, the substrate is Si <111>. Alternatively, the substrate can be for instance Ge <111>. According to still other embodiments, the substrate can be a Si substrate with a crystalline Ge cap, epitaxially grown on top of the Si substrate. There may also be a graded SiGe transition layer between the Si and the Ge.

According to other preferred embodiments, the substrate is a Si on insulator (SOI) substrate. In still other embodiments, the substrate can be a SiC substrate or a sapphire substrate or a free-standing GaN or free-standing AlN substrate.

The epitaxial layer structure can comprise one or more (In)AlGaN buffer layers between the substrate and the III-N layer stack, and comprises an InAlGaN channel layer and an InAlGaN barrier layer. These channel and barrier layers are then capped in-situ with a passivation layer stack, of which at least the starting layer or layers are crystalline.

(In)AlGaN buffer layers are in an example individually typically 500 nm thick (thickness preferably within the range of 50 nm to 2 μm), with an Al content typically varying between 0%-100%, preferably between 1%-99%, more preferably between 20% and 90%, such as for instance 50%. These buffer layers can also optionally comprise another group III-element, such as Indium. A total (In) AlGaN buffer is typically 100 nm to 10 μm thick, such as from 500 nm to 5 μm thick.

According to preferred embodiments, the thickness of the InAlGaN channel layer is within the range of 5 nm to 2 μm. For instance, the thickness of the channel layer can be within the range of 20 nm to 1 μm, or within the range of 20 nm and 500 nm, or within the range between 20 nm to 250 nm, 50 nm to 200 nm, such as for instance 150 nm.

According to preferred embodiments, the thickness of the InAlGaN barrier layer is within the range of 1 nm to 50 nm. For instance, the thickness of the barrier layer is preferably within the range of 5 nm to 25 nm, such as for instance 20 nm.

According to preferred embodiments, the thickness of any of the individual layers in the passivation layer stack are within the range of 0.1 nm to 500 nm. For instance, the thickness of the Al- or B-doped SiN, or AlSiN or BSiN is preferably within the range of 0.1 nm to 50 nm, 3 nm to 15 nm, such as for instance 10 nm. The AlN or BN layer preferably has a thickness within the range of 0.1 nm and 10 nm, preferably in the range of 0.5 nm to 3 nm, as for instance 1 nm. The less doped or non-doped SiN preferably has a thickness within the range of 10 nm to 1 μm, preferably in the range of 50 nm to 500 nm, for instance of 200 nm. Preferably, the passivation layer stack comprises or consists of SiN and/or AlSiN (or BSiN) and/or Al-doped (or B-doped) SiN layers with high density, which are deposited in-situ in a MOCVD reactor. Alternatively, at least part of the Al-free or less Al-doped SiN may be deposited ex-situ, preferably by LPCVD, but also possibly by PECVD.

According to preferred embodiments, the device further comprises at least one gate contact extending through the SiN sub layer, and if present through the AlN or BN layer, the gate contact contacting the fully crystalline sub layer.

According to preferred embodiments, comprising the AlN or BN layer, the device further comprises at least one gate contact extending through the SiN sub layer, the gate contact contacting the AlN or BN layer.

According to preferred embodiments, the device further comprises at least one gate contact substantially extending through the SiN sub layer, and if present through the AlN or BN layer, and being separated from the fully crystalline sub layer by means of one or more a high-k dielectric layers. The high-k dielectric layer can for instance comprise Al-oxide, or Hf-oxide, or Zr-oxide.

According to preferred embodiments, comprising the AlN or BN layer, the device further comprises at least one gate contact substantially extending through the SiN sub layer and being separated from said AlN or BN by means of one or more high-k dielectric layers.

The combination of in-situ grown Al-doped or B-doped SiN and a high-k dielectric is advantageous as it can improve the gate dielectric.

According to preferred embodiments, the device further comprises at least one gate contact substantially extending through the SiN sub layer and being separated from said fully crystalline sub layer by means of an Aluminum oxide layer, the Aluminum oxide being at the same level as the AlN. According to preferred embodiments, the high-k dielectric, the aluminum oxide, is formed by local oxidation (thermal, plasma, ozone) of the AlN intermediate layer.

According to preferred embodiments, the III-Nitride is GaN.

According to preferred embodiments, the Al-III-N is InAlGaN, with the relative composition of the III elements being x for In, y for Al and 1-x-y for Ga; with x and y taking values between 0 and 1. According to preferred embodiments, x is 0 and y is 1. According to preferred embodiments, x is 0.17 and y is 0.83. According to preferred embodiments, x is 0 and y takes values between 0 and 1.

According to preferred embodiments, the passivation layer is fully crystalline, and comprises Al or B.

According to preferred embodiments, the passivation layer is fully crystalline, and is Al-doped or B-doped.

According to preferred embodiments, the total thickness of the passivation layer is larger than 200 nm.

According to a second aspect of the present invention, a method is disclosed for manufacturing a device comprising a III-N layer stack featuring a two-dimensional electron gas, comprising:
  providing a III-N layer;
  providing a Al-III-N layer on top of the III-N layer;
  providing a passivation layer on top of the Al-III-N layer, the passivation layer comprising Silicon Nitride (SiN); wherein providing the passivation layer comprises providing a fully crystalline sub layer at the Al-III-N interface, at least part of the fully crystalline sub layer comprising Al or B.

According to preferred embodiments, providing the passivation layer comprises providing a second SiN sub layer on top of the fully crystalline sub layer, which is not Al-doped or is less Al-doped than the fully crystalline sub layer.

According to preferred embodiments, the second SiN sub layer does not comprise Al-, does not comprise B-, or does not comprise any of Al and B.

According to preferred embodiments, the fully crystalline sub layer comprises Al and the second SiN sub layer comprises less Al than the fully crystalline sub layer. For instance the fully crystalline sub layer can be Al doped and the second layer can be less Al-doped than the fully crystalline sub layer.

According to preferred embodiments, the fully crystalline sub layer comprises B and the second SiN sub layer comprises less B than the fully crystalline sub layer. For instance the fully crystalline sub layer is B doped and the second layer is less B-doped than the fully crystalline sub layer.

According to preferred embodiments, the method further comprises providing an AlN or BN layer in between the fully crystalline sub layer and the second SiN sub layer.

According to preferred embodiments, the method further comprises providing at least one gate contact extending through the second SiN sub layer, and if present through the AlN or BN layer, the gate contact contacting the fully crystalline sub layer.

According to preferred embodiments, the method further comprises providing at least one gate contact extending through the second SiN sub layer, the gate contact contacting the AlN or BN layer.

According to preferred embodiments, the method further comprises
  performing a contact etch through the second SiN sub layer, and if present through the AlN or BN layer, hereby defining a contact region on the fully crystalline sub layer;
  providing a high-k dielectric layer in at least the contact region;
  providing a contact in the contact region on top of the high-k dielectric layer.

According to preferred embodiments, the method further comprises
  performing a contact etch through the second SiN sub layer, hereby defining a contact region on the fully crystalline sub layer;
  providing a high-k dielectric layer in at least the contact region;
  providing a contact in the contact region on top of the high-k dielectric layer.

According to preferred embodiments, the method further comprises
  performing a contact etch through the second SiN sub layer up until the AlN layer, hereby defining a contact region on the AlN layer;
  oxidizing the AlN layer at least in the contact region;
  providing a contact in the contact region on top of the oxidized contact region.

It will be appreciated by the skilled person that features and advantages described in relation with the first aspect of the present invention, are also applicable, mutatis mutandis, to the second aspect of the present invention.

BRIEF DESCRIPTION OF THE DRAWINGS

Further features of the present invention will become apparent from the drawings, wherein:

FIG. 5A, FIG. 5B and FIG. 5C illustrate further embodiments according to the present invention, including the use of a high-k dielectric layer.

DETAILED DESCRIPTION OF EMBODIMENTS

Figure 1:
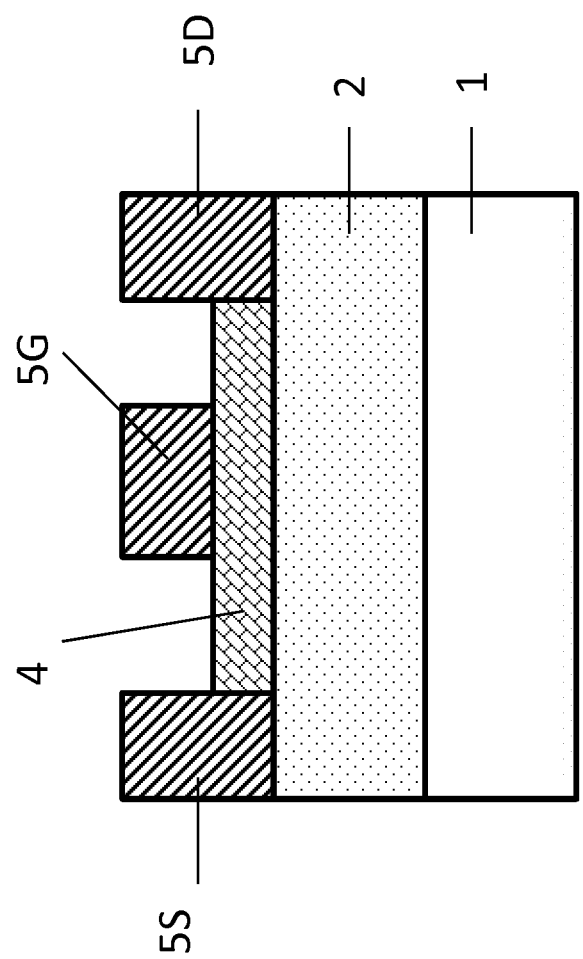
FIG. 1 is a schematic cross-sectional view of a prior art semiconductor device.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. Where the term "comprising" is used in the present description and claims, it does not exclude other elements or steps. Where an indefinite or definite article is used when referring to a singular noun e.g. "a" or "an", "the", this includes a plural of that noun unless something else is specifically stated.

The term "comprising", used in the claims, should not be interpreted as being restricted to the means listed thereafter; it does not exclude other elements or steps. Thus, the scope of the expression "a device comprising means A and B" should not be limited to devices consisting only of components A and B. It means that with respect to the present invention, the only relevant components of the device are A and B.

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

In the drawings, like reference numerals indicate like features; and, a reference numeral appearing in more than one figure refers to the same element.

FIG. 1 illustrates a prior art transistor type device, wherein a SiN layer 4, on top of a layer stack comprising a GaN layer 1 and an InAlGaN layer 2 on top of the GaN layer 1, is used as a gate dielectric of the transistor device. The transistor device can for instance comprise a source 5S, a drain 5D and a gate 5G. The SiN layer 4 should not be too thick, because separating the actual gate 5G from the two Dimensional Electron Gas (2 DEG) reduces the capacitive coupling between the two which results in a lower transconductance of the device and a threshold voltage which is negative and too high for practical applications. Ideally a SiN gate dielectric layer is between 3 nm and 10 nm thick.

Figure 2:
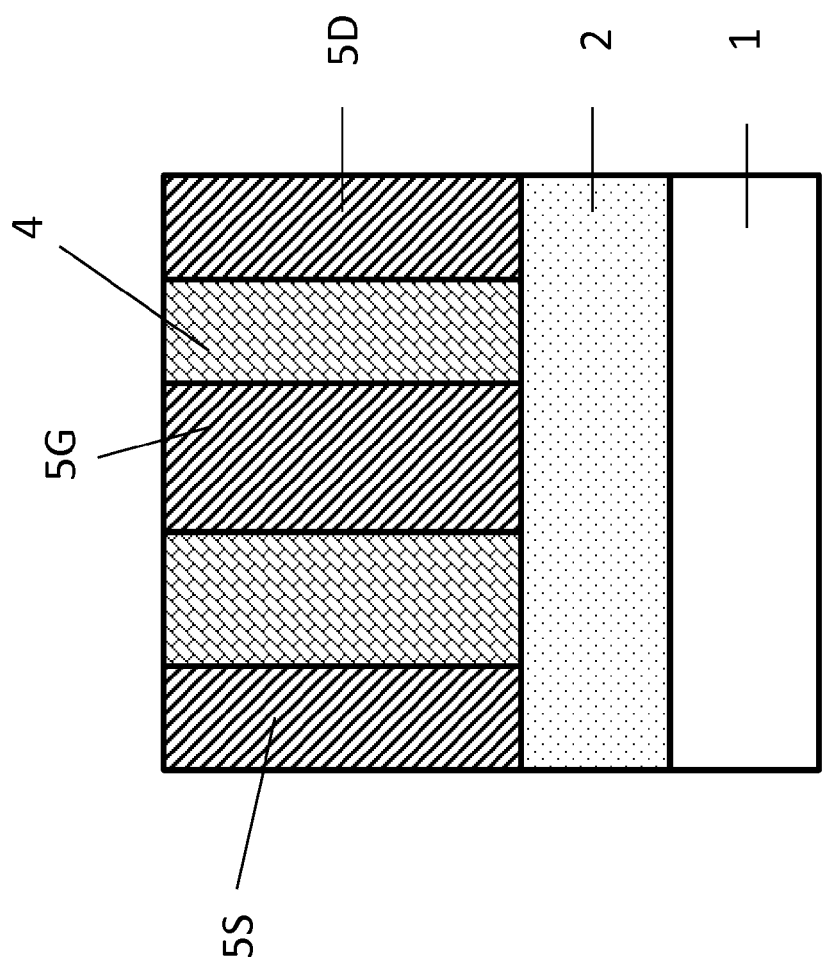
FIG. 2 is a schematic cross-sectional view of another prior art semiconductor device.

FIG. 2 illustrates another prior art transistor type device, wherein the SiN is used as passivation layer for III-N HEMT devices. Passivation is important because of dispersion effects and possible changes in the dynamic behavior of such devices. It has been shown that the passivation layer should be sufficiently thick (for instance having a thickness larger than 200 nm).

Figure 3:
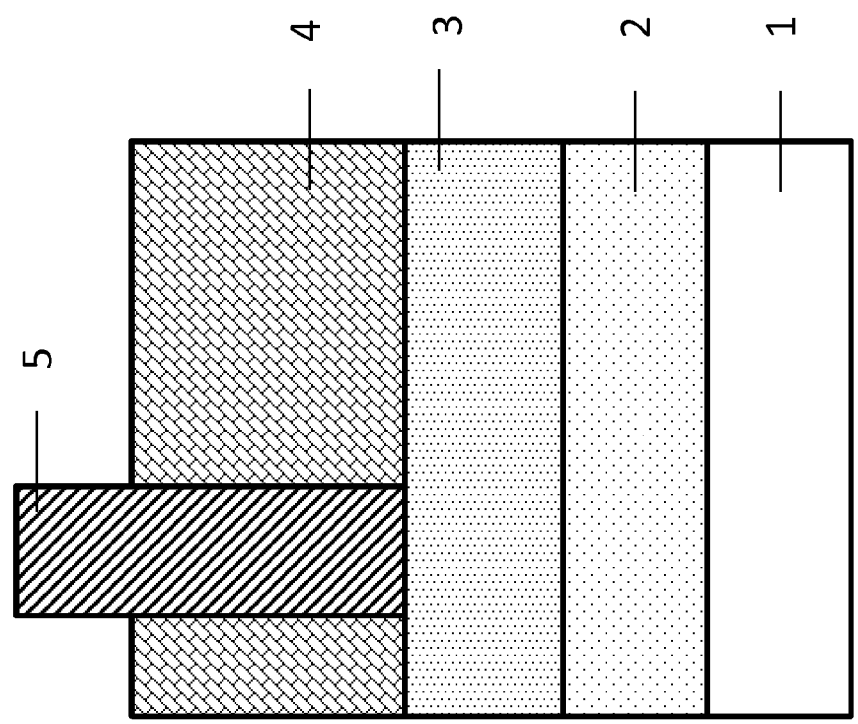
FIG. 3 is a schematic cross-sectional view of an embodiment according to the present invention.

A first embodiment according to the present invention is depicted in FIG. 3. On a GaN substrate 1, an epitaxial layer or layer stack is provided, comprising an InAlGaN layer 2. A passivation layer comprising a first sub layer 3 of Al-doped SiN and a second sub layer 4 of less doped or non-doped SiN, provided on the first sub layer, is provided on top. The second sub layer 4 of less doped or non-doped SiN is etched in order to provide contact regions within the second sub layer. This etch can be performed selectively with respect to the first sub layer. Then one or more metal layers are provided to form a contact 5 in the contact region.

Figure 4B:
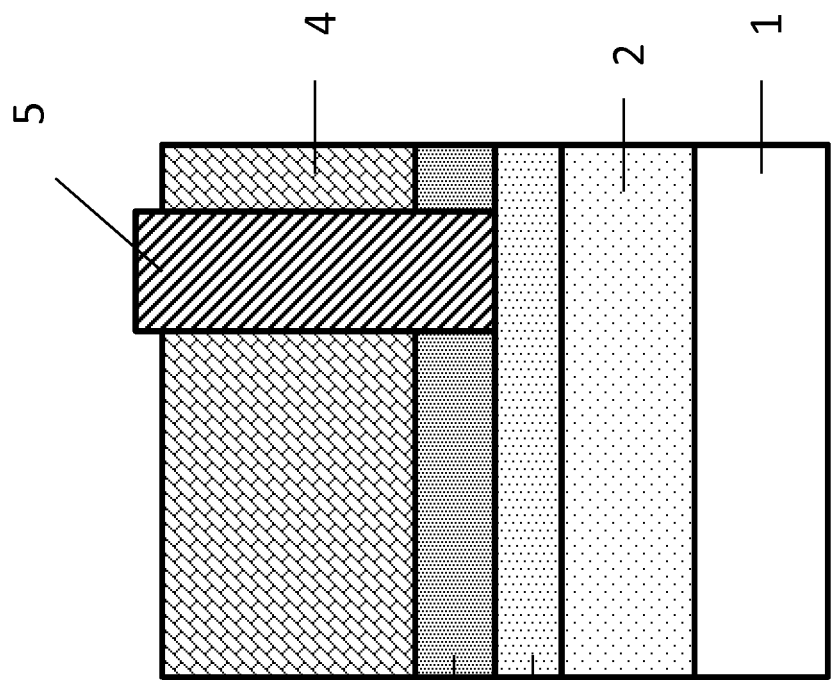
FIG. 4A and FIG. 4B illustrate further embodiments according to the present invention, including a further AlN layer.
Figure 4A:
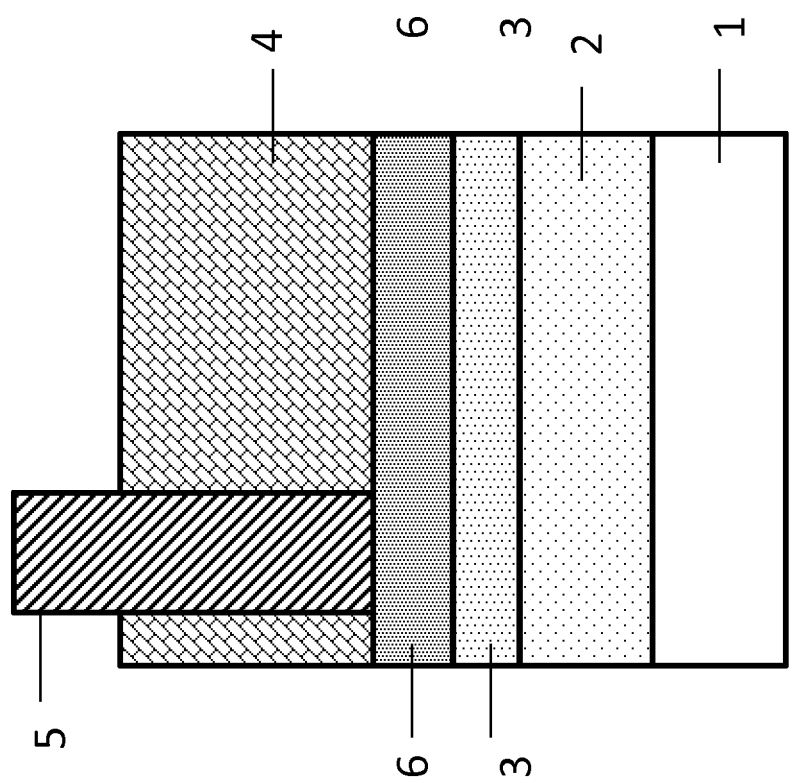

A second embodiment according to the present invention is depicted in FIG. 4A. On a GaN substrate 1, an epitaxial layer or layer stack is provided, comprising an InAlGaN layer 2. A passivation layer comprising a first sub layer 3 of Al-doped or B-doped SiN, an intermediate sub layer 6 comprising a AlN or BN layer on top of the first layer, and a second sub layer 4 of less doped or non-doped SiN, provided on the intermediate sub layer, is provided on top. The second sub layer 4 of less doped or non-doped SiN is etched in order to provide contact regions within the second sub layer. This etch can be performed selectively with respect to the intermediate sub layer, e.g. AlN or BN layer 6, for instance by using a dry etching process based on Flourine chemistry: this type of etch is commonly used to etch SiN, but has a much reduced etch rate when Al or B containing layers are used. As such a high selectivity is obtained between the etch rate of SiN and the etch rate of B or Al-containing materials. Then one or more metal layers are provided to form a contact 5 in the contact region. In FIG. 4B an alternative embodiment is depicted, which is similar to the embodiments described in relation to FIG. 4A, but wherein the contact etch extends through the intermediate sub layer 6. The contacts 5 then reach through to intermediate sub layer 6 and contact the first SiN sub layer.

In FIG. 5A, still an alternative embodiment of the present invention is illustrated. This embodiment corresponds to the embodiments described for FIG. 3, but further comprises the deposition of a high-k dielectric layer 7 in at least the contact region defined by the contact etch, before depositing the one or metal layers defining the contact 5. The contact layers forming the contact 5 are thus separated from the first sub layer 3 in the contact region, by means of the high-k dielectric layer.

In FIG. 5B, a similar embodiment as the embodiment described in relation to FIG. 4B is illustrated. This embodiment includes the deposition of a high-k dielectric layer 7 in at least the contact region before depositing the one or more metal layers forming the gate contact 5, wherein the contact etch extends through the intermediate sub layer 6, contacting the first SiN sub layer 3. The contact layers forming the contact 5 are thus separated from the first sub layer 3 in the contact region, by means of the high-k dielectric layer.

Figure 5C:
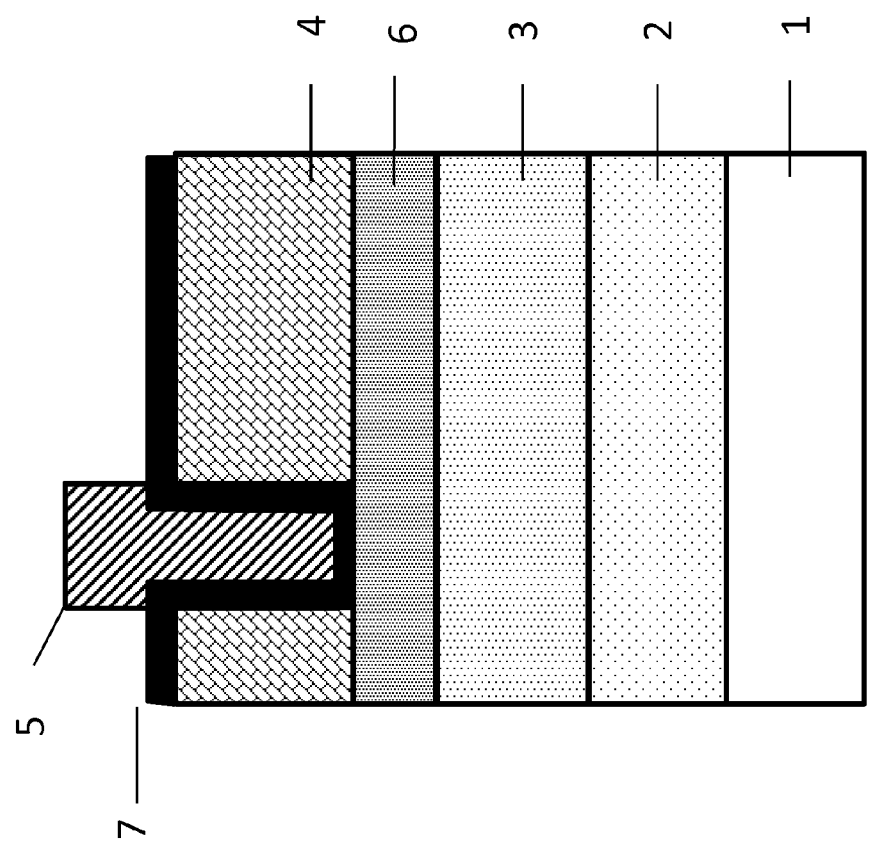

In FIG. 5C, a further alternative embodiment is illustrated, which is based on the embodiment described in relation to FIG. 4A. Similar to what is described for instance for FIG. 5A, the method comprises the deposition of a high-k dielectric layer 7 in at least the contact region defined by the contact etch, before depositing the one or metal layers defining the contact 5. An intermediate sub layer 6, e.g. AlN or BN layer, is present, but the contact etch or contact region does not extend through the intermediate sub layer 6. Thereby the contact 5 is separated from the intermediate sub layer 6 by means of the high-k dielectric layer 7.

Figure 6:
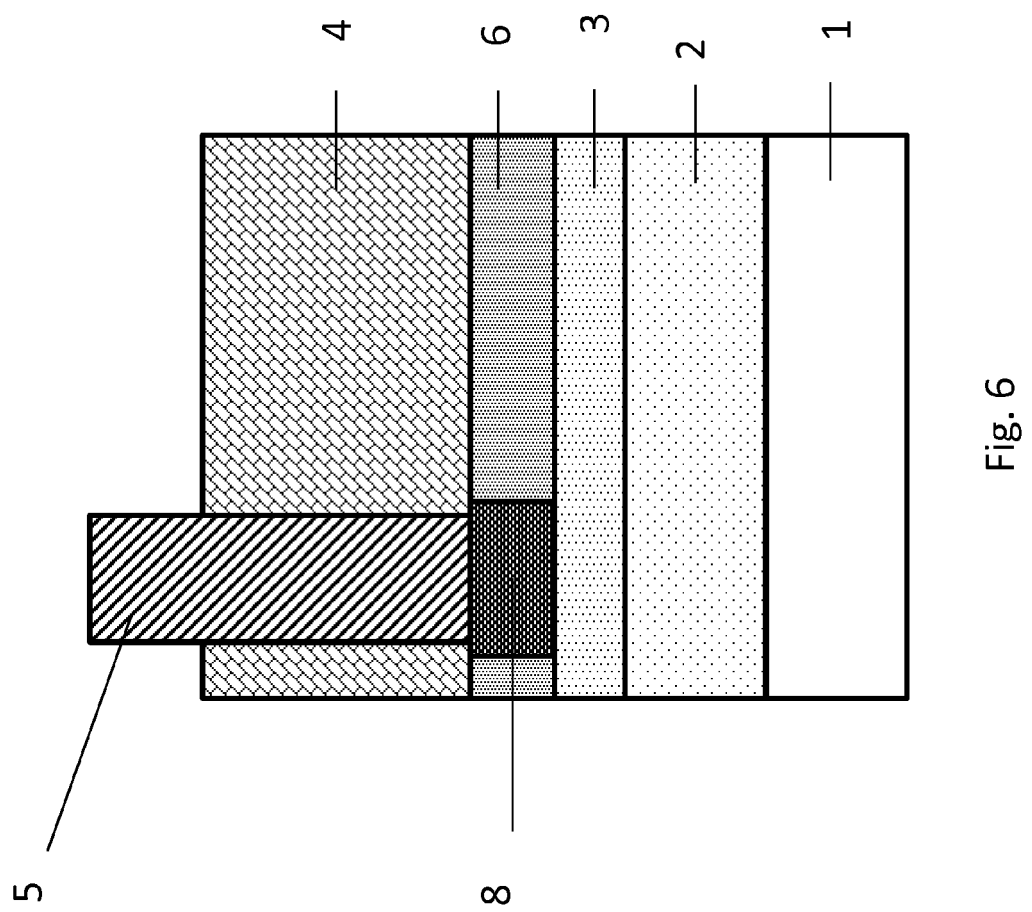
FIG. 6 illustrates a further embodiment of the present invention, including a partially oxidized AlN layer in a contact region of the device.

In FIG. 6, a still alternative embodiment is illustrated. The embodiment is similar to the embodiments depicted in FIG. 4A. Here, the contact etch is performed through the second sub layer of the passivation stack, up until the top surface of the intermediate sub layer 6. Subsequently, at least the contact region (comprising the bottom of the opening etched in the contact etch step) is oxidized, thereby transforming the AlN in Aluminum oxide (AlOx) in at least the contact region. Then the contact 5 is formed by providing one or more metal layers.

Examples of more specific processing parameters and options are described below, and, unless indicated specifically, can be applicable to any of the embodiments described above, as a skilled person will recognize.

For instance, the processing of the active device contains several process steps, described below, which can be combined in various orders, either once or repeatedly, using methods and work logic known to a person skilled in the art.

The epitaxial layer stack or structure can comprise one or more (In)AlGaN buffer layers 2, comprising an InAlGaN channel layer and an InAlGaN barrier layer. These are capped in-situ with a passivation layer stack (3, 4, 6, 7, 8), of which at least the starting layer or layers are crystalline.

The AlGaN buffer layers are individually typically 300 nm thick (thickness preferably within the range of 50 nm to 500 nm), with an Al content typically varying within the range between 0% to 100%, preferably within the range between 1% to 99%, more preferably within the range between 20% to 90%, such as for instance 50%. These buffer layers can also optionally comprise another group III-element, such as Indium. A total AlGaN buffer is typically 100 nm to 10 µm thick, such as from 500 nm to 5 µm thick.

The passivation stack comprises at least a first SiN layer 3 which is Al-doped, and a second SiN layer 4 which is not or less Al doped. These SiN layers may be stoechiometric or non-stoechiometric. In a preferred example, the Al-concentration in the first SiN layer is higher than in the second SiN layer. In an example the total SiN layer is typically 50 nm to 500 nm thick, such as for instance 200 nm thick. In certain embodiments, the in-situ SiN layers may be thickened externally by PECVD or LPCVD SiN, or SiOx (for thicknesses beyond 500 nm), or SiC, or diamond, or any other material or material stack, prior to any other processing steps.

In an example, the processing of the active device contains a process step to form ohmic contacts 5. In an example, this is done by starting with deposition of photoresist and a lithography step defining the areas of the ohmic contacts 5. The passivation layer is then completely or partially removed. In an example this removal is done in a dry etching system based on fluorine chemistry, e.g. in an inductively coupled plasma system using $SF_6$ or $CF_4$ as etching gas and RF (or "platen") and ICP (or "coil") etching powers of 10 W and 150 W respectively. Because of the composition of the different layers of the passivation stack, the etching rates of the different SiN layers are different, and etch selectivity between the different layers is obtained. This allows for selective removal of only some of the SiN layers in the passivation stack. In an example, only the second SiN layer and an AlN layer in the stack, the latter which can be present as described in further embodiments, are removed in the area of the ohmic contacts. Alternatively, the complete passivation stack can be removed in the area of the ohmic contacts.

Once the areas of the ohmic contacts 5 are defined, a metal layer or a stack of metal layers can be deposited, e.g. by thermal evaporation, or by sputtering, or by e-beam evaporation. The metal can for instance comprise Ti and Al. In an example, the Ti and Al are further capped by another metal (such as a refractory metal or Ti or Ni) and/or Au. Metal patterns are consecutively defined by performing lift-off of the metal, on top of the photoresist and not in contact with the barrier layer. In another example, the photoresist is first removed, then the metal stack comprising Ti and Al is deposited, and then a second photoresist deposition and photolithography step are done to allow dry etching of the metal stack in areas where it is unwanted and removing the photoresist. In a next step, the thus defined metal patterns are subjected to one or more alloying steps, e.g. a rapid thermal annealing step for a duration of one minute in a reducing or inert atmosphere such as (hydrogen or forming gas or nitrogen gas) at a temperature between 800° C. and 900° C.

Preferably, the processing of the active device contains a process step to define the isolation patterns. This is done by performing photoresist deposition and a photolithography step. In an example the photoresist patterns thus formed act as a mask for the etching of a mesa, e.g. in a dry etching system based on chlorine chemistry, e.g. in an inductively coupled plasma system using $Cl_2$ or $BCl_3$ as etching gas and RF (or "platen") and ICP (or "coil") etching powers of 50 W and 150 W respectively. In another example, patterns thus formed act as a mask for impurity implantation, e.g. by implanting nitrogen, helium, hydrogen, boron, iron, or magnesium. In an example, the impurity implantation uses triple implantation steps, e.g. one step at an acceleration voltage of 30 keV, implanting a dose of 6 times $10^{12}$/cm2 of $N^{14}$, a second step at an acceleration voltage of 160 keV, implanting a dose of 1.8 times $10^{13}$/cm2 of $N^{14}$ and a third step at an acceleration voltage of 400 keV, implanting a dose of 2.5 times $10^{13}$/cm2 of $N^{14}$. In another example, the definition of the isolation patterns, either by mesa etching or impurity implantation is preceded by removal of some layers or all layers of the passivation stack, e.g. by dry etching in an inductively coupled plasma system using $SF_6$ or $CF_4$ as etching gas. In another example, the definition of the isolation patterns by impurity implantation is followed by removal of some layers or all layers of the passivation stack, e.g. by dry etching in an inductively coupled plasma system using $SF_6$ or $CF_4$ as etching gas.

In an example, the processing of the active device contains a process step to define the gate foot. In a preferred example, this is done by starting with deposition of photoresist and a lithography step defining the foot of the gate contact by partially removing the passivation layer. In this way, some layers of the passivation stack remain below the gate contact and form a gate dielectric to reduce trapping effects and leakage current. In an example this removal is done in a dry etching system based on fluorine chemistry, e.g. in an inductively coupled plasma system with a low damage etching process, e.g. using $SF_6$ or $CF_4$ as etching gas and RF (or "platen") and ICP (or "coil") etching powers of 10 W and 150 W respectively at a pressure of 20 mTorr.

Because of the composition of the different layers of the passivation stack, the etching rates of the different SiN layers are different, and etch selectivity between the different layers is obtained. This allows for selective removal of only some of the SiN layers in the passivation stack. In a preferred example, only the second SiN layer (non-doped or less doped SiN layer) is removed in the area of the gate foot. In this way, the first SiN layer and the AlN layer remain below the gate contact and form a gate dielectric to reduce trapping effects and leakage current. In an example, a recovery step is done after the local removal of only the second SiN layer of the passivation stack, in which the photoresist is removed and the, if present according to certain embodiments, exposed AlN layer is subjected to recovery or conversion steps, e.g. by thermal annealing at a temperature between 300° C. and 600° C. in ammonia, or hydrogen, or oxygen, or nitrogen, or ozone or by plasma treatment in ammonia, or hydrogen, or oxygen, or nitrogen, or ozone chemistry or by partial etch-back of the top part of the AlN layer, or by any combination of the afore-mentioned treatments.

In another example, both the second SiN layer and the, if present according to certain embodiments, AlN are removed in the area of the gate foot. In this way, the first SiN layer remains below the gate contact and form a gate dielectric to reduce trapping effects and leakage current. An optional recovery step is done after the local removal of both the second SiN layer and the AlN layer of the passivation stack, in which the photoresist is removed and the exposed first SiN layer is subjected to recovery or conversion steps, e.g. by thermal annealing at a temperature between 300° C. and 600° C. in ammonia, or hydrogen, or oxygen, or nitrogen, or ozone or by plasma treatment in ammonia, or hydrogen, or oxygen, or nitrogen, or ozone chemistry or by partial etch-back of the top part of the first SiN layer, or by any combination of the afore-mentioned treatments.

In an example, after the recovery step, photoresist deposition and a lithography step is performed, well aligned to the gate foot. Then the gate metal stack is deposited, e.g. comprising Ni, Pt, W, WN, or TiN and capped by Al, Au or Cu. Metal patterns are consecutively defined by performing lift-off of the metal on top of the photoresist and not in contact with the barrier layer. In a preferred example, after the recovery step, the gate metal stack is deposited, e.g. comprising Ni, Pt, W, WN, or TiN and capped by Al, Au or Cu. Then photoresist deposition and a lithography step is performed, well aligned to the gate foot. The thus defined photoresist patterns act as a mask for the dry etching of the metal stack in areas where it is unwanted. Next the photoresist is removed.

In another example, after the recovery step, another dielectric layer such as a high-k dielectric, such as Aluminium-oxide, or Hf-oxide, or Zirconium-oxide, is deposited or formed prior to the metal deposition.

In an example, the processing of the active device contains a process step to add additional passivation layers. In an example, the passivation layer comprises SiN or Si-oxide, e.g. deposited by LPCVD, or PE-CVD or ICP-CVD. In an example, openings are made in the passivation layer to uncover the device terminals, by performing a photolithography step and etching the passivation layer, e.g. by wet etching in HF or buffered HF or by dry etching in an RIE or ICP plasma tool in a fluorine chemistry.

According to preferred embodiments, the processing of the active device contains a process step to define additional metal interconnect layers using methods known to a person skilled in the art, to allow low resistivity pathways for the gate, source and drain currents.

It is to be understood that the invention is not limited to the particular features of the means and/or the process steps of the methods described as such means and methods may vary. It is also to be understood that the terminology used herein is for purposes of describing particular embodiments only, and is not intended to be limiting. It must be noted that, as used in the specification and the appended claims, the singular forms "a" "an" and "the" include singular and/or plural referents unless the context clearly dictates otherwise. It is also to be understood that plural forms include singular and/or plural referents unless the context clearly dictates otherwise. It is moreover to be understood that, in case parameter ranges are given which are delimited by numeric values, the ranges are deemed to include these limitation values.

The particular combinations of elements and features in the above detailed embodiments are exemplary only. As those skilled in the art will recognize, variations, modifications, and other implementations of what is described herein can occur to those of ordinary skill in the art without departing from the spirit and the scope of the invention as claimed. Accordingly, the foregoing description is by way of example only and is not intended as limiting. The invention's scope is defined in the following claims and the equivalents thereto. Furthermore, reference signs used in the description and claims do not limit the scope of the invention as claimed.

The invention claimed is:

1. A device comprising a III-N layer stack featuring a two-dimensional electron gas, comprising:
   a III-N layer;
   a Al-III-N layer on top of said III-N layer;
   a passivation layer on top of said Al-III-N layer, said passivation layer comprising Silicon Nitride (SiN); and
   an interface between the Al-III-N layer and the passivation layer;
   wherein said passivation layer comprises a fully crystalline SiN sub layer at the interface, the fully crystalline SiN sub layer being epitaxially matched to the Al-III-N layer, at least part of said fully crystalline SiN sub layer comprising Al and/or B.

2. A device according to claim 1, wherein said fully crystalline SiN sub layer comprises at least a few crystalline monolayers at the interface with the Al-III-N layer.

3. A device according to claim 2, wherein said fully crystalline SiN sub layer has a thickness between 0.1 and 20 nm.

4. A device according to claim 1, wherein said fully crystalline SiN sub layer comprises Al and/or B throughout the fully crystalline SiN sub layer.

5. A device according to claim 1, wherein at least part of said fully crystalline SiN sub layer or all of said fully crystalline SiN sub layer is Al and/or B doped, the Al or B in the fully crystalline SiN sub layer is present in a concentration within a range going from impurity doping levels of about $1e15/cm^3$ up to about $1e23/cm^3$.

6. A device according to claim 1, wherein:
   said passivation layer further comprises a second SiN sub layer on top of said fully crystalline SiN sub layer, wherein said fully crystalline SiN sub layer comprises Al and wherein said second SiN sub layer comprises less Al than said fully crystalline SiN sub layer; or
   said passivation layer further comprises a second SiN sub layer on top of said fully crystalline SiN sub layer, wherein said fully crystalline SiN sub layer comprises B and wherein said second SiN sub layer comprises less B than said fully crystalline SiN sub layer.

7. A device according to claim 6, further comprising an AlN layer or BN layer in between said fully crystalline SiN sub layer and said second SiN sub layer.

8. A device according to claim 6, further comprising at least one gate contact extending through said second SiN sub layer, said gate contact contacting said fully crystalline SiN sub layer.

9. A device according to claim 7, further comprising at least one gate contact extending through said second SiN sub layer, said gate contact contacting said AlN or BN layer.

10. A device according to claim 6, further comprising at least one gate contact substantially extending through said second SiN sub layer, and being separated from said fully crystalline SiN sub layer by a high-k dielectric layer.

11. A device according to claim 7, further comprising at least one gate contact substantially extending through said second SiN sub layer and being separated from said AlN or BN layer by a high-k dielectric layer.

12. A device according to claim 7, further comprising at least one gate contact substantially extending through said second SiN sub layer and being separated from said fully crystalline SiN sub layer by an Aluminum oxide layer, said Aluminum oxide layer being at the same level as the AlN layer.

13. A device according to claim 1, wherein said III-Nitride is GaN and said Al-III-N is InAlGaN, with the relative composition of the InAlGaN being x for In, y for Al and 1-x-y for Ga; with x and y taking values between 0 and 1.

14. A device according to claim 1, wherein said passivation layer is fully crystalline, and comprises Al and/or B.

15. A device according to claim 14, wherein said passivation layer is fully crystalline, and is Al-doped and/or B-doped, the Al or B in the fully crystalline SiN sub layer being present in a concentration within a range going from impurity doping levels of about $1e15/cm^3$ up to about $1e23/cm^3$.

16. A device according to claim 1, wherein the total thickness of the passivation layer is larger than 200 nm.

17. A method for manufacturing a device comprising a III-N layer stack featuring a two-dimensional electron gas, comprising:
    providing a III-N layer;
    providing a Al-III-N layer on top of said III-N layer;
    providing a passivation layer on top of said Al-III-N layer, said passivation layer comprising Silicon Nitride (SiN), thereby providing an interface between the Al-III-N layer and the passivation layer;
wherein said passivation layer comprises a fully crystalline SiN sub layer at the interface, the fully crystalline SiN sub layer being epitaxially matched to the Al-III-N layer, at least part of said fully crystalline SiN sub layer comprising Al and/or B.

18. The method according to claim 17, wherein providing said passivation layer comprises providing a second SiN sub layer on top of said fully crystalline SiN sub layer, wherein said second SiN sub layer does not comprise Al, does not comprise B, or does not comprise any of Al and B.

19. The method according to claim 17, wherein providing said passivation layer comprises providing a second SiN sub layer on top of said fully crystalline SiN sub layer, wherein said fully crystalline SiN sub layer comprises Al and wherein said second SiN sub layer comprises less Al than said fully crystalline SiN sub layer.

20. The method according to claim 17, wherein providing said passivation layer comprises providing a second SiN sub layer on top of said fully crystalline SiN sub layer, wherein said fully crystalline SiN sub layer comprises B and wherein said second SiN sub layer comprises less B than said fully crystalline SiN sub layer.

21. A method according to claim 17, further comprising providing an AlN or BN layer in between said fully crystalline SiN sub layer, and a second SiN sub layer.

22. A method according to claim 21, further comprising providing at least one gate contact extending through said second SiN sub layer, through said AlN or BN layer, said gate contact contacting said fully crystalline SiN sub layer.

23. A method according to claim 21, further comprising providing at least one gate contact extending through said second SiN sub layer, said gate contact contacting said AlN or BN layer.

24. A method according to claim 22, further comprising
    performing a contact etch through said second SiN sub layer, through said AlN or BN layer, hereby defining a contact region on said fully crystalline SiN sub layer;
    providing a high-k dielectric layer in at least said contact region;
    providing a contact in said contact region on top of said high-k dielectric layer.

25. A method according to claim 23, further comprising
    performing a contact etch through said second SiN sub layer, hereby defining a contact region;
    providing a high-k dielectric layer in at least said contact region;
    providing a contact in said contact region on top of said high-k dielectric layer.

26. A method according to claim 21, wherein an AlN layer is provided in between said fully crystalline SiN sub layer and said second SiN sub layer, further comprising
    performing a contact etch through said second SiN sub layer, hereby defining a contact region;
    oxidizing said AlN layer at least in said contact region;
    providing a contact in said contact region on top of said oxidized AlN layer.

27. A device according to claim 1, wherein said fully crystalline SiN sub layer comprises B.

* * * * *